(12) United States Patent
Kim

(10) Patent No.: US 9,161,468 B2
(45) Date of Patent: Oct. 13, 2015

(54) ELECTRIC BOX FOR VEHICLE

(71) Applicant: Hyundai Motor Company, Seoul (KR)

(72) Inventor: Jin Gi Kim, Jeonju (KR)

(73) Assignee: Hyundai Motor Company, Seoul (KR)

( * ) Notice: Subject to any disclaimer, the term of this patent is extended or adjusted under 35 U.S.C. 154(b) by 143 days.

(21) Appl. No.: 13/715,393

(22) Filed: Dec. 14, 2012

(65) Prior Publication Data

US 2014/0041891 A1    Feb. 13, 2014

(30) Foreign Application Priority Data

Aug. 13, 2012    (KR) .......................... 10-2012-0088322

(51) Int. Cl.
*H05K 5/06* (2006.01)
*H02G 3/08* (2006.01)

(52) U.S. Cl.
CPC . *H05K 5/06* (2013.01); *H02G 3/083* (2013.01)

(58) Field of Classification Search
CPC .................................... H05K 5/06; H02G 3/83
See application file for complete search history.

(56) References Cited

U.S. PATENT DOCUMENTS

| 5,811,728 | A  | * | 9/1998 | Maeda ......................... 174/652 |
| 7,544,887 | B2 | * | 6/2009 | Iizuka ............................. 174/50 |
| 8,426,737 | B2 | * | 4/2013 | Maebashi ................. 174/152 R |

FOREIGN PATENT DOCUMENTS

| JP | 06-117579 A | 4/1994 |
| JP | 09139584 A | 5/1997 |
| JP | 11098647 A | 4/1999 |
| JP | 2000260243 A | 9/2000 |
| JP | 2002017025 A | 1/2002 |
| JP | 2002095133 A | 3/2002 |
| JP | 2011010514 A | 1/2011 |
| KR | 10-2008-0035749 | 4/2008 |
| KR | 10-2010-0070137 A | 6/2010 |
| KR | 10-2010-0084890 A | 7/2010 |

* cited by examiner

*Primary Examiner* — Tuan T. Dinh
*Assistant Examiner* — Ahmad D Barnes
(74) *Attorney, Agent, or Firm* — Mintz Levin Cohn Ferris Glovsky and Popeo, P.C.; Peter F. Corless

(57) ABSTRACT

Disclosed herein is an electric box for a vehicle including a box body and a cover wherein the box includes a storage space and cover is coupled to the box body to seal the storage space. The box body further includes a wire insertion passageway through which the wire is upwardly inserted into the box body.

9 Claims, 8 Drawing Sheets

ELECTRIC BOX FOR VEHICLE

CROSS-REFERENCE

This application claims under 35 U.S.C. §119(a) the benefit of Korean Patent Application No. 10-2012-0088322 filed Aug. 13, 2012, the entire contents of which are incorporated herein by reference.

BACKGROUND OF THE INVENTION (a) Field of the Invention

The present invention relates to an electric box for a vehicle, which may minimize the space required for withdrawing wires from the box and may increase the waterproof characteristic of the box.

(b) Description of the Related Art

Conventionally, an electric box (e.g., a junction box or a fuse box) may be used to connect a power source to various electric devices that consume electricity in vehicles. Such electric devices may include lamps, electric components of a vehicle body, multi-media devices, and motor driving devices. Additionally, a plurality of fuses may be installed in the electric box to protect an overcurrent or overload from being delivered to external circuits. Furthermore, various types of relays may be installed to provide or cut off electric supply.

Thus, the electric box may serve as a supplier and a distributor of battery power, as well as a protection for wires inside a vehicle. The electric box may include many other functions such as receiving and protecting various types of elements (fuses, relays, etc.) mounted therein, and maintaining operational efficiency through heat radiation.

In many vehicles, the electric box may be installed in the engine room, but in many commercial vehicles such as large trucks or buses, the electric box may be installed at a certain location inside the vehicle with a structure in which individual wires or wire harnesses may be connected to the inner portion of the box. In addition, due to the characteristics of electrical components, a high level waterproof may be required. Specifically, waterproofing describes the ability of an object or component to substantially block the intake or absorption of water.

Furthermore, since the electric box may include a plurality of wires connected to the inside thereof and may be installed in a narrow space inside vehicles, the design of the electric box should consider the interior space of a vehicle for layout difficulties such as withdrawal direction of wires.

Moreover, in many vehicles, the junction box or the fuse box may be installed in the narrow engine room and may include wires connected directly to the terminal portion of the box. Additionally, the junction box or the fuse box may have an integral structure in which the box and the wiring are not separated. Accordingly, the junction box or the fuse box may have limited a waterproof characteristic.

The electric boxes equipped in commercial vehicles such as large trucks may also have limited a waterproof characteristic. Additionally, in order to implement a satisfactory waterproof structure, the withdrawal direction (or the direction the wire is connected to the box) of a wire may be the lateral direction of the box as shown in FIG. 1.

Furthermore, however, when viewed from the top of the box cover, a region of wiring withdrawal space must be designated on the side of the box. Accordingly, there may be limitations in installing the box in a narrow space and difficulties in securing substantial space within the box for withdrawing wires.

The information disclosed above is only for enhancement of understanding the background of the invention and therefore it may contain information that does not form the prior art that is already known to a person of ordinary skill in the art.

SUMMARY OF THE INVENTION

The present invention provides an electric box for a vehicle, which may minimize the required space for withdrawing a wire from the box in a downward direction. Additionally, the present invention provides an electric box for a vehicle, which may increase the waterproof characteristic of the electric box.

In one embodiment, the present invention provides an electric box for a vehicle having a wire connected thereto, including: a box body having a storage space; a cover coupled to the box body configured to seal the storage space, wherein the box body includes a wire insertion passageway for an upward insertion of the wire to be connected to the inside of the box body.

In an exemplary embodiment, the wire insertion passageway may be formed at a side surface of the box body for the wire to be upwardly inserted therethrough. The wire insertion passageway may have a side surface opening. The cover may include a side surface portion extending from the cover to cover the side surface of the wire insertion passageway, thereby substantially sealing the electric box.

In another exemplary embodiment, the electric box may include a waterproof grommet disposed on an outer circumference of the wire inside the wire insertion passageway. Furthermore, the grommet may include a side surface portion connected to an inner side surface of the wire insertion passageway to seal a gap between the wire insertion passageway and the wire. The grommet may include a sealing protrusion compressed on the inner side surface of the wire insertion passageway along the circumference thereof to seal the gap. Additionally, the grommet may be moved down the wire insertion passageway to be seated on seating protrusion protruding from the inner side surface of the wire insertion passageway. The protruding portion may be inserted into a guide groove formed in the grommet. Further, the seating protrusion may protrude from the inner side surface of the wire insertion passageway to support the grommet.

In a further exemplary embodiment, the box body may have a plurality of rail grooves on both side ends of the box corresponding to both side ends of the side surface portion of the cover. Furthermore, both side ends of the side surface portion of the cover may slide into the rail grooves of the box body.

In still another further exemplary embodiment, the cover may include a protrusion portion on an outer surface of both side ends of the side surface portion thereof, and the box body may include an insertion groove corresponding to the protrusion portion of the cover and a stopper under the insertion groove to guide and stop the protrusion portion along the insertion groove.

In yet another further exemplary embodiment, the box body may include a cover locking portion at a lower end of the wire insertion passageway covered by the side surface portion of the cover to prevent a lower end of the side surface portion of the cover from being outwardly separated when the lower end of the side surface portion of the cover is inserted into the cover locking portion.

BRIEF DESCRIPTION OF THE DRAWINGS

The above and other features, objects and advantages of the present invention will now be described in detail with reference to exemplary embodiments thereof illustrated the accompanying drawings which are given hereinbelow by way of illustration only, and thus are not limitative of the present invention, and wherein.

Figure 1:
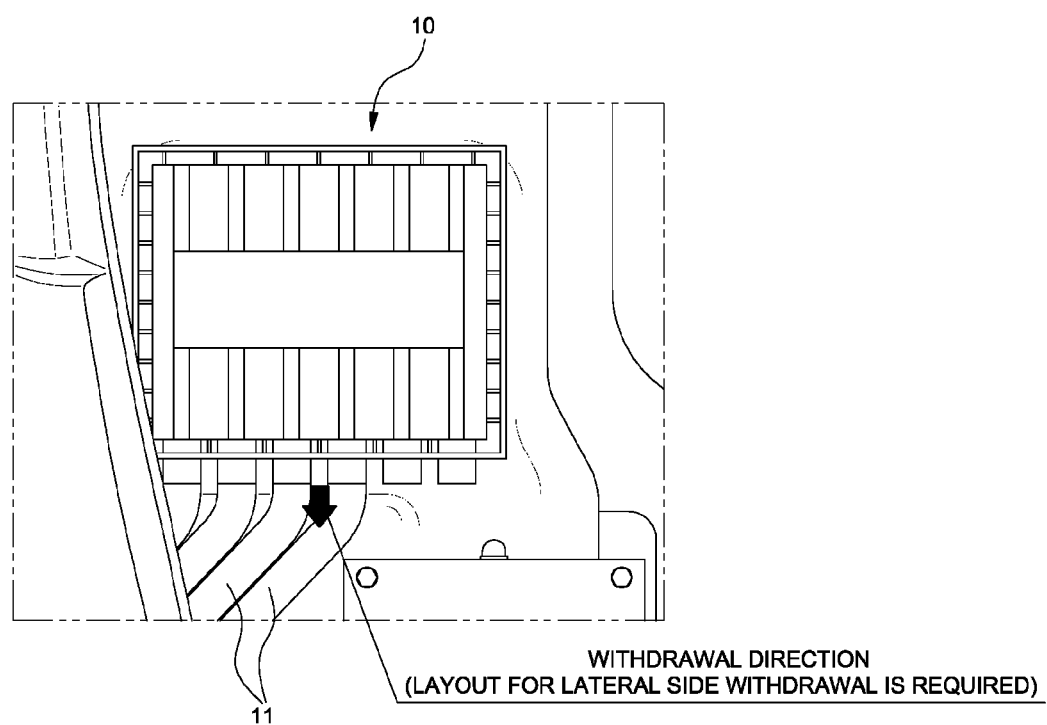
FIG. 1 is an exemplary view illustrating a conventional electric box, according the related art.

Reference numerals set forth in the Drawings includes reference to the following elements as further discussed below:

| 100: electric box | 102: wire |
| 110: box body | 114: wire insertion passageway |
| 115: grommet | 115a: sealing protrusion |
| 115b: guide groove | 117a: seating protrusion |
| 117b: seating portion | 118: rail groove |
| 119a: insertion groove | 119b: stopper |
| 119c: cover locking portion | 120: cover |
| 121: upper surface portion | 122: side surface portion |
| 124: protrusion portion | |

It should be understood that the accompanying drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DESCRIPTION OF PREFERRED EMBODIMENTS

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter reference will be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Hereinafter, exemplary embodiments of the present invention will be described in detail with reference to the accompanying drawings so that those skilled in the art may easily carry out the present invention.

The present invention relates to an electric box for a vehicle, which may minimize the space for withdrawing a wire in a downward direction from the electric box (e.g., wire is set to be connected to the box in the upward direction). In addition, the present invention provides an electric box for a vehicle with a substantially improved waterproof characteristic.

Figure 2:
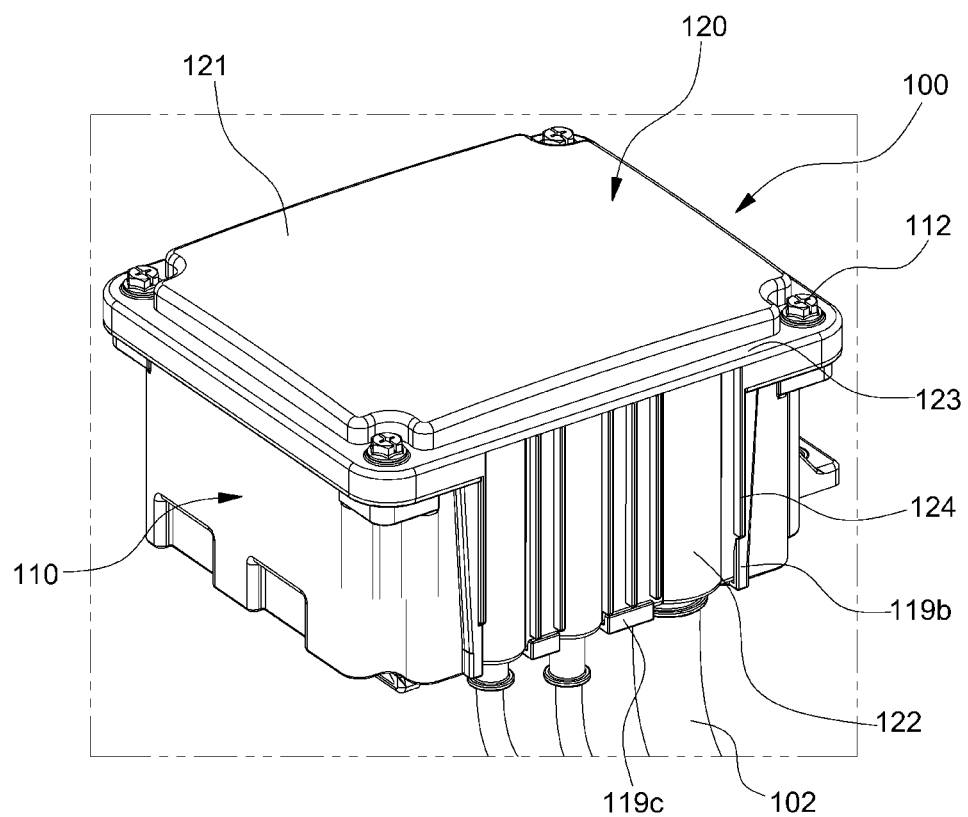
FIG. 2 is an exemplary view illustrating an electric box according to an embodiment of the present invention.
Figure 3:
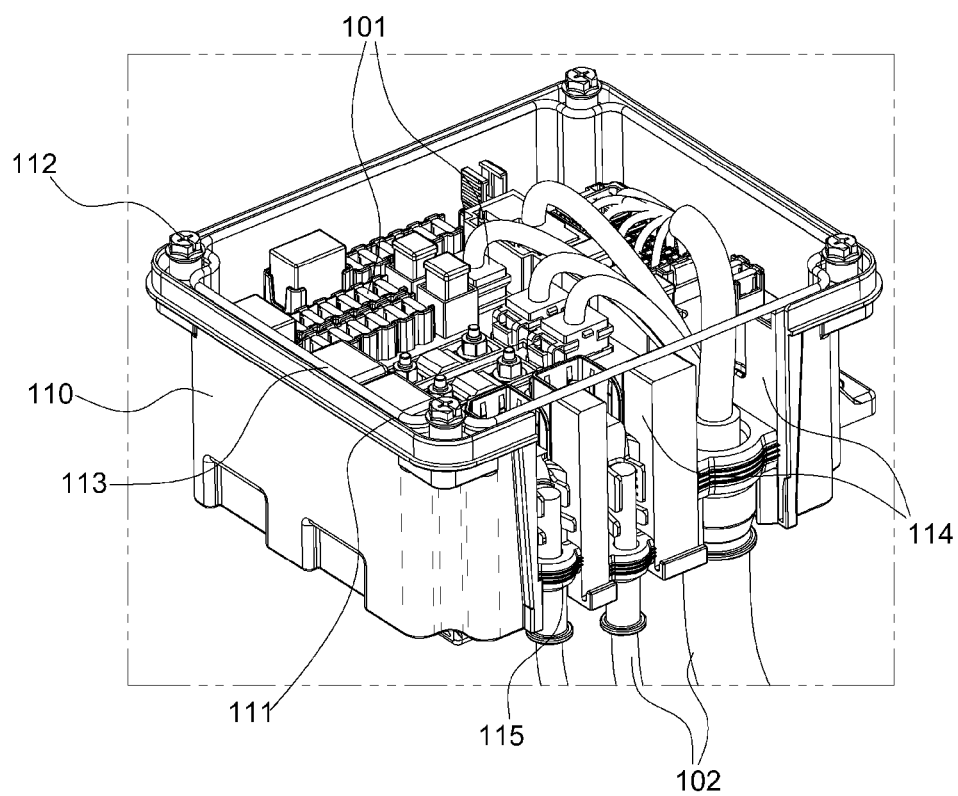
FIG. 3 is an exemplary view illustrating a main body of an electric box without a cover according to an embodiment of the present invention.

FIG. 2 is an exemplary view illustrating an electric box according to an embodiment of the present invention. FIG. 3 is an exemplary view illustrating a main body of an electric box without a cover according to an embodiment of the present invention.

As illustrated in the drawings, an electric box 100 may include a box body 110 housing a plurality of elements 101 such as a fuse or a relay mounted in a printed circuit board, and a cover 120 coupled to the box body 110 configured to cover an upper surface and a side surface of the box body 110. The box body 110 may include a storage space for receiving a printed circuit board mounted with the plurality of elements 101 and various types of components. The box body 110 may have a rectangular parallelepiped shape.

The cover 120 may be coupled to the box body 110 to seal the storage space, and may cover the upper surface and a side surface of the box body 110. The cover may include an upper surface portion 121 to cover the upper surface of the box body 110 and a side surface portion 122 extending from the edge of the upper surface portion 121 to cover the side surface (e.g., a side surface of a wire insertion passageway described below) of the box body 110. Additionally, to connect the box body 110 and the cover 120, a coupling end 123 (e.g., an edge portion of the cover 120) may be connected to a coupling end 111 of the top of the box body 110, the coupling ends 123 and 111 of the box body 110 and the cover 120 may be connected by bolts 112 at the corners thereof. When the cover 120 is connected to the box body 110, the storage space of the box body 110 may be completely sealed, and a sealing member 113 may be inserted between the coupling end 111 of the top of the box body 110 and the coupling end 123 of the cover 120 to prevent moisture in the electric box 100.

In the electric box 100, a wire 102 (including a wire harness) may be upwardly inserted into and connected to the box body 110. In addition, the box body 110 may include a wire insertion passageway 114 on a side thereof to allow the wire 102 to be longitudinally inserted into the box body 110. The electric box 100 may include a wire insertion passageway 114 for each wire 102 (or wire harness) which may be open on the side surface thereof. When the cover 120 is connected to the box body 110, the side surface portion 122 of the cover 120 may cover the side surface of the wire insertion passageway 114.

Figure 4:
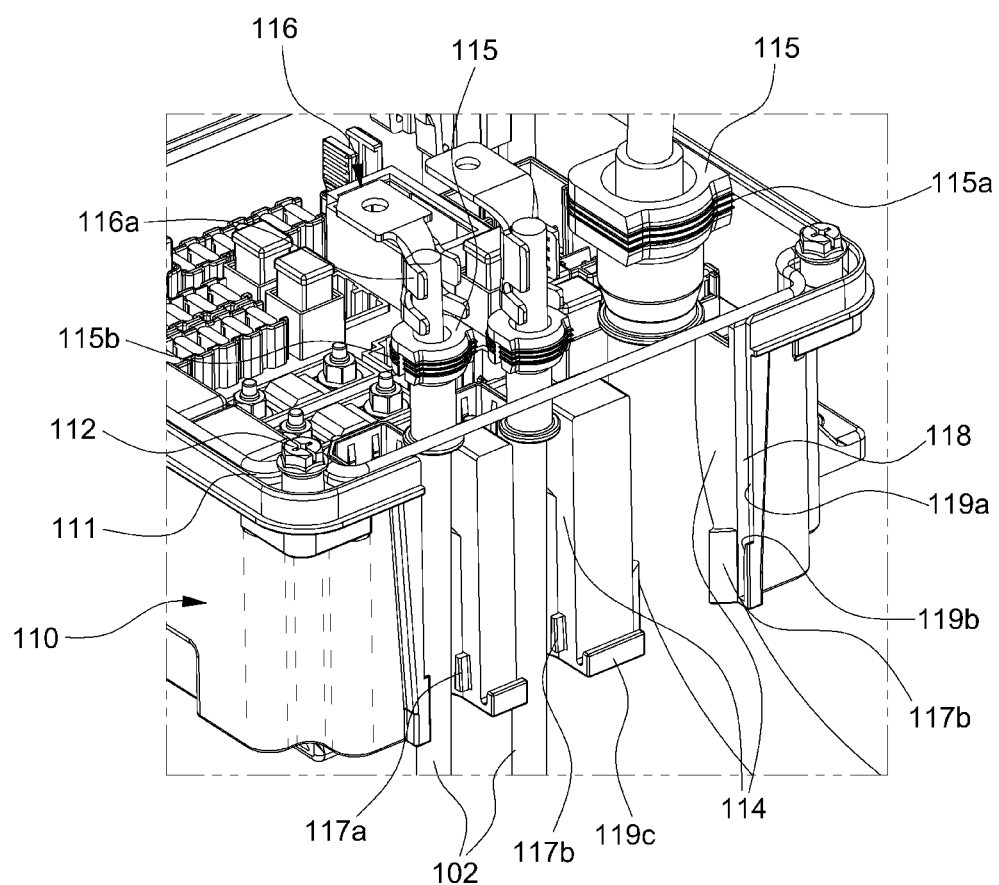
FIGS. 4 and 5 are exemplary views illustrating an electric box in which a wire and a grommet are coupled according to an embodiment of the present invention.
Figure 5:
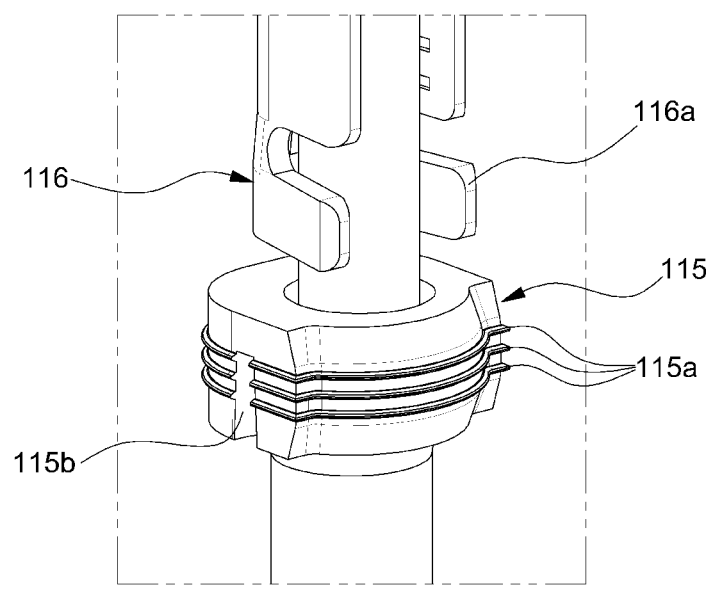

Additionally, a grommet 115 may be disposed on an end portion of the wire to improve a waterproof characteristic. FIGS. 4 and 5 are exemplary views illustrating an electric box in which a wire and a grommet are coupled according to an embodiment of the present invention.

As illustrated in the drawings, a grommet 115 may be disposed on the outer circumference of the end portion of the wire 102. Once the wire 102 is inserted into the wire insertion passageway 114, the grommet 115 may be coupled on the end portion of the wire 102. Referring to FIGS. 4 and 5, when the wire 102 is inserted into the wire insertion passageway 114 of the box body 110, the grommet 115 having a ring shape may be disposed on the outer circumference of the end portion of the wire 102. Alternately, the grommet 115 may be coupled to the end portion of the wire 102 prior to inserting the wire 102 into the wire insertion passageway 114.

In addition, the end portion of the wire 102 may be inserted into a barrel portion 116a of a terminal 116. The barrel portion 116a of the terminal 116 may be designed to compress the end portion of the wire 102 such that the terminal 116 and the wire 102 may be integrally combined and electrically connected.

When the side surface portion 122 of the cover 120 is coupled to the box body 110, the grommet 115 may serve as a sealing member substantially removing a gap between the outer circumferential surface of the wire 102 and the inner circumferential surface of the wire insertion passageway 114 and may prevent moisture between the wire 102 and the wire insertion passageway 114.

In an exemplary embodiment, a plurality of sealing protrusions 115a may be disposed on the side surface portion of the grommet 115 to increase the sealing and waterproof characteristics of the box 100. The plurality of sealing protrusions 115a may be compressed on the inner side surface of the wire insertion passageway 114. The sealing protrusion 115a may provide additional sealing between the wire 102 and the inner surface of the wire insertion passageway 114. Thus, a dual sealing structure may be provided by the grommet 115 and the sealing protrusion 115a between the wire insertion passageway 114 and the wire 102. Additionally, the dual sealing structure may substantially improve a waterproof characteristic where the wire 102 is inserted into the box. For example, as illustrated in FIG. 5, three sealing protrusions 115a may be disposed along the side surface portion of the grommet 115. Furthermore, a triple sealing structure may only be provided with these sealing protrusions 115a.

In addition, the grommet 115 may be disposed on the outer circumference of the end portion of the wire 102, and may be slid down to the inside of the wire insertion passageway 114. Further, the grommet 115 may be seated on the seating protrusion protruding from the inner side of the wire insertion passageway 114.

Figure 6:
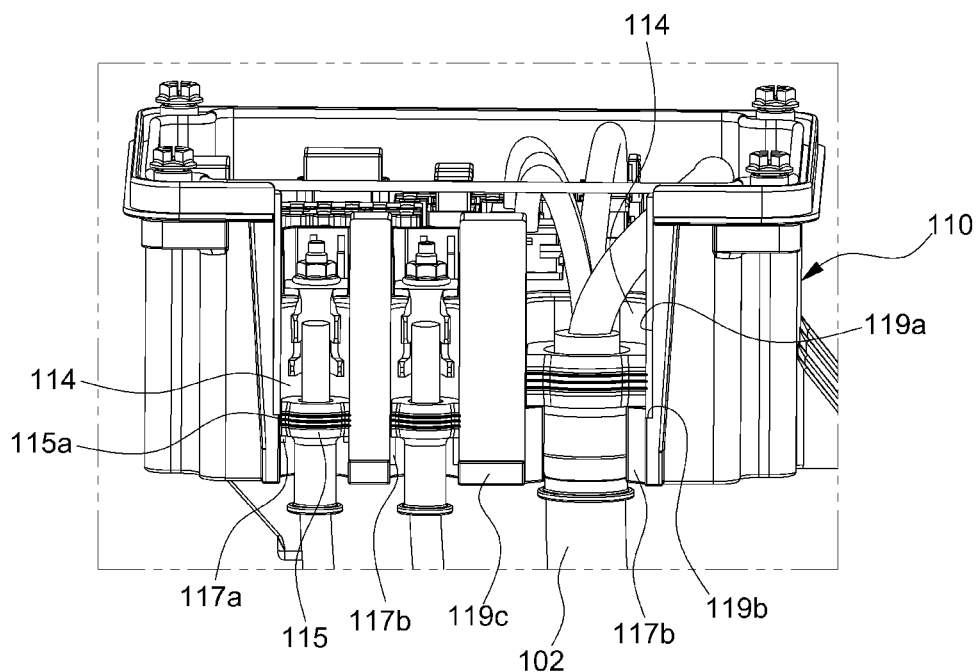
FIG. 6 is an exemplary view illustrating a grommet coupled with a wire seated on a seating portion in an electric box according to an embodiment of the present invention.

FIG. 6 is an exemplary view illustrating a grommet coupled with a wire seated on a seating portion protruding in an electric box according to an embodiment of the present invention.

In an exemplary embodiment, the seating portion protruding may be a seating protrusion 117a that protrudes from the inner side surface of the wire insertion passageway 114. The seating protrusion 117a may fit into a guide groove (115b in FIG. 5) that may be formed in the side surface portion of the grommet 115. Specifically, the grommet 115 couple to the end portion of the wire 102 may be slid down to the inside of the wire insertion passageway 114 such that the seating protrusion 117 fits into the guide groove 115b of the grommet 115. Thus, the grommet 115 may be stably seated and supported in the wire insertion passageway 114.

Additionally, a seating protrusion 117b on which the lower surface of the grommet 115 may be disposed, as shown in FIG. 6, may protrude from the inner side surface of the wire insertion passageway 114 to become a seating protrusion 117b on which the lower surface of the grommet 115 is placed. The seating protrusion 117b may protrude from the inner side surface of the wire insertion passageway 114 such that the grommet 115 may be slid into the wire insertion passageway 114 may be seated thereon.

One or both of the seating protrusions 117a, 117b may be applied to the present invention. FIG. 6 illustrates an example in which both of the seating protrusions 117a, 117b are applied.

Furthermore, the grommet 115 may be formed of synthetic rubber, such as an elastic rubber (i.e., Ethylene Propylene Diene Monomer (EPDM)).

Figure 7:
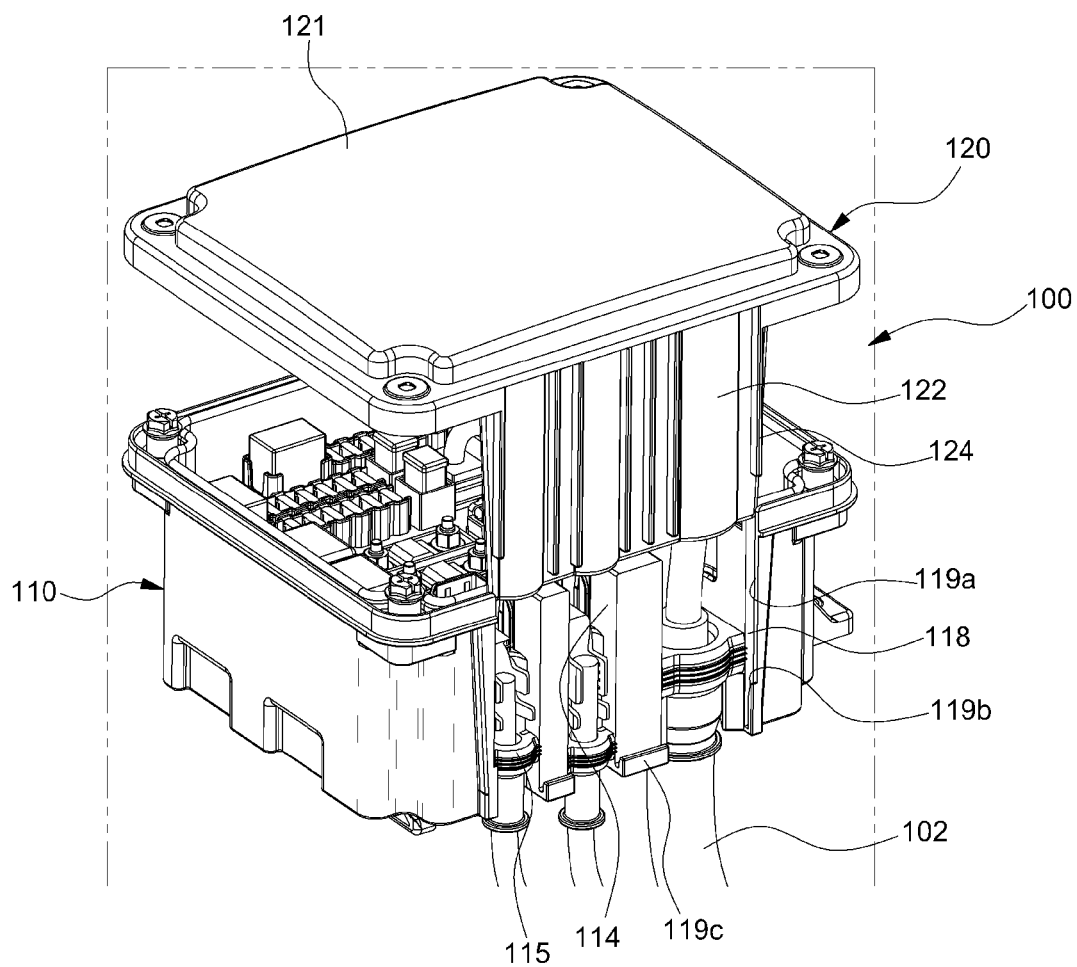
FIG. 7 is an exemplary view illustrating a cover coupled with a box body in an electric box according to an embodiment of the present invention.
Figure 8:
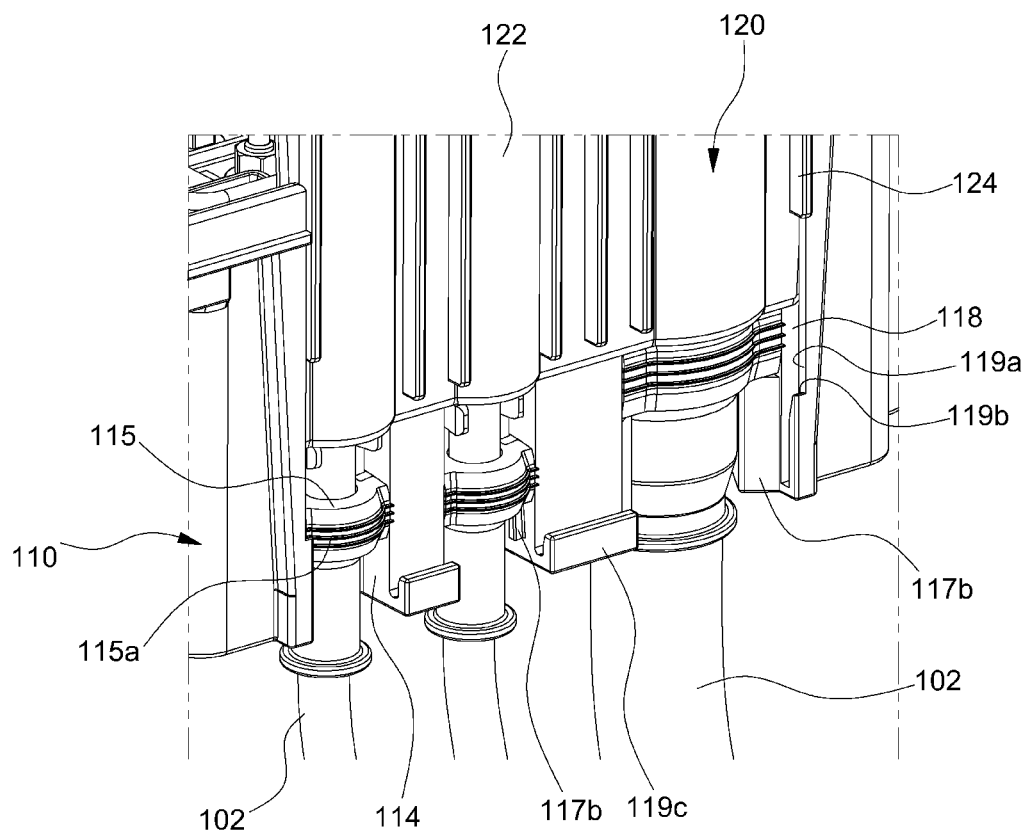
FIG. 8 is an exemplary view illustrating an assembly location of a cover locking portion of a box body and a side portion of a cover in an electric box according to an embodiment of the present invention.

FIG. 7 is an exemplary view illustrating a cover coupled with a box body in an electric box according to an embodiment of the present invention. FIG. 8 is an exemplary view illustrating an assembly location of a cover locking portion of a box body and a side portion of a cover in an electric box according to an embodiment of the present invention.

As illustrated in the drawings, when the wire 102, the grommet 115, and the box body 110 are assembled, the cover 120 may be coupled to the box body 110 to seal the box body 110. The cover 120 may include a side surface portion 122 that extending downwardly and covering a side surface of the wire insertion passageway 114 (i.e., one side surface portion of the box body 110). Furthermore, an edge of the side surface portion 122 of the cover 120 may be coupled to the corresponding portion of the box body 110 through a groove fitting method. More specifically, as shown in FIGS. 7 and 8, rail grooves 118 may be formed on both side ends of the side surface portion 122 of the box body 110 such that both ends of the side surface portion 122 of the cover 120 may be guided along the rail groove 118.

In this groove fitting structure, the side surface portion 122 of the cover 120 may slide along the rail groove 118 of the box body 110 when inserted into the rail groove 118. Since both side ends of the side surface portion 122 of the cover 120 may be inserted into the rail groove 118, moisture may be substantially eliminated from the box body 110, particularly, from the wire insertion passageway 114. Furthermore, both side ends of the side surface portion 122 of the cover 120 or the inside of the rail groove 118 may be coated with a lubricant oil to smoothen the sliding insertion. In addition, a pad may be attached to both side ends of the side surface portion 122 of the cover 120 or to the inside of the rail groove 118 to improve the waterproof characteristic of the box.

Moreover, as shown in FIGS. 7 and 8, a protrusion portion 124 may be formed on the outer surface of both side ends of the side surface portion 122 of the cover 120, and an insertion groove 119a may be formed at the corresponding location on the side surface portion 122 of the box body 110. A stopper 119b may be disposed under the insertion groove 119a such that the protrusion portion 124 of the cover 120 may be stopped. Furthermore, the protrusion portion 124 may be vertically disposed on the outer surface of both side ends of the side surface portion 122 of the cover 120. The insertion groove 119a may also be vertically disposed in the side surface portion 122 of the box body 110.

Thus, when the cover 120 is coupled to the box body 110, the protrusion portion 124 of the cover 120 may be guided downwardly when inserted into the insertion groove 119a of the box body 110. When the side surface portion 122 of the cover 120 reaches the final coupling location, the protrusion portion of the cover 120 may be seated on the stopper 119b under the insertion groove 119a, allowing the protrusion portion 124 to be supported by the stopper 119b.

The protrusion portion 124 may improve the efficiency of insertion characteristics of the side surface portion 122 of the cover 120. The cover 120 may be more easily coupled to the box body 110 since the protrusion portion 124 may slide downwardly when inserted into the insertion groove 119a to allow the side surface portion 122 of the cover 120 to cover the outer side of the wire insertion passageway 114.

Additionally, a separation-preventing cover locking portion 119c may be disposed under the side surface portion 122 of the box body 110, i.e., the lower end of the wire insertion passageway 114 covered by the cover side surface portion 122. When the lower end of the cover side surface portion 122 is inserted into the rail groove 118, the cover locking portion 119c may prevent the lower end of the cover side surface portion 122 from separating from the rail groove 118.

Thus, since an electric box for a vehicle may minimize the space required for withdrawing a wire out of the box, the interior space and layout of the box may be maximized. In addition, in the electric box for the vehicle, the waterproof characteristic of the box may be improved by a coupling structure between a cover and a box body and a grommet for sealing between the box and the wire.

The invention has been described in detail with reference to exemplary embodiments thereof. However, it will be appreciated by those skilled in the art that changes, modifications and variations may be made in these embodiments without departing from the principles and spirit of the invention, the scope of which is defined in the appended claims and their equivalents.

What is claimed is:

1. An electric box for a vehicle having a wire connected thereto, comprising:
    a box body including a storage space;
    a cover coupled to the box body to seal the storage space, wherein the box body includes a wire insertion passageway through which the wire is upwardly inserted to connect to the inside of the box body, and
    a waterproof grommet disposed on an outer circumference of an end portion of the wire inside the wire insertion passageway,
    wherein the waterproof grommet includes a side surface portion adhered to an inner side surface of the wire insertion passageway to seal a gap between the wire insertion passageway and the wire, and
    wherein the end portion of the wire is inserted into a barrel portion of a terminal and the barrel portion of the terminal is configured to compress the end portion of the wire such that the terminal and the wire are integrally combined and electrically connected.

2. The electric box of claim 1, wherein the wire insertion passageway is formed on a side surface portion of the box body and includes a side surface opening.

3. The electric box of claim 2, wherein the box body includes a plurality of rail grooves on both side ends thereof on which both side ends of the side surface portion of the cover are inserted.

4. The electric box of claim 2, further comprising:
    a protrusion portion on an outer surface of both side ends of the side surface portion thereof;
    an insertion groove disposed on the box body corresponding to the protrusion portion of the cover; and
    a stopper disposed under the insertion groove to guide the protrusion portion of the cover along the insertion groove and to stop the protrusion portion at the stopper.

5. The electric box of claim 2, wherein the box body comprises a cover locking portion disposed at a lower end of the wire insertion passageway configured to prevent a lower end of the side surface portion of the cover from being separated from the wire insertion passageway.

6. The electric box of claim 1, wherein the cover includes a side surface portion extending from the cover configured to cover the side surface of the wire insertion passageway to seal the electric box.

7. The electric box of claim 1, wherein the waterproof grommet comprises a sealing protrusion compressed on the inner side surface of the wire insertion passageway along the circumference thereof to seal the gap.

8. The electric box of claim 1, wherein the waterproof grommet slides downwardly in the wire insertion passageway to be seated on and supported by a seating portion protruding from the inner side surface of the wire insertion passageway.

9. The electric box of claim 1, wherein a seating portion protrudes from the inner side surface of the wire insertion passageway and is inserted into a guide groove formed in the waterproof grommet.

\* \* \* \* \*